United States Patent [19]

Sato et al.

[11] Patent Number: 5,693,375

[45] Date of Patent: Dec. 2, 1997

[54] METHOD FOR TRANSFERRING INK BY PRINTING METHOD

[75] Inventors: Hisatake Sato, Yokohama; Makoto Sasaki, Kamakura, both of Japan

[73] Assignee: Nippon Oil Co., Ltd., Tokyo, Japan

[21] Appl. No.: 552,012

[22] Filed: Nov. 2, 1995

[30] Foreign Application Priority Data

Nov. 9, 1994 [JP] Japan ..................... 6-275305
Oct. 6, 1995 [JP] Japan ..................... 7-259966

[51] Int. Cl.⁶ ..................... C08F 2/46
[52] U.S. Cl. ............. 427/522; 427/128; 427/130; 427/132; 427/282; 427/385.5; 427/544; 427/547; 427/591; 427/598

[58] Field of Search ..................... 427/466, 522, 427/547, 544, 532, 591, 598, 128, 130, 132, 282, 385.5

*Primary Examiner*—Bernard Pianalto
*Attorney, Agent, or Firm*—Darby & Darby

[57] ABSTRACT

A method for transferring ink on a plate onto a material to be printed by a printing method involves the steps of: providing the ink at predetermined positions on the plate, the ink being sensitive to a field to increase its viscosity so as to have a solidified state or a semi-solidified state; applying the field to the ink to maintain configuration of the ink provided at the predetermined positions on the plate; and transferring the ink onto the material to be printed while maintaining the ink in the solidified or semi-solidified state.

15 Claims, 5 Drawing Sheets

METHOD FOR TRANSFERRING INK BY PRINTING METHOD

BACKGROUND OF THE INVENTION

This invention related to a method for transferring ink by a printing method for fabricating a printed matter, a wiring for a printed wiring board or a color filter for liquid crystal display at a low cost with high precision.

The printing method has so far been known as an inexpensive method for producing a large number of duplicates. Among the known methods for producing a color filter for liquid crystal display, there are a dyeing method for dyeing a pattern formed using a photolithographic technique, a method employing a photosensitive resin composition having a pigment or a dye dispersed therein, an electrodeposition method consisting in forming a desired pattern on a transparent electrically conductive film and supplying the electric current through only the pattern to be colored for electrodeposition, and an electrophotographic system consisting in depositing a color toner on a transfer substrate by an electrophotographic system for forming a pixel and transferring the pixel to a separate filter substrate. Among these known methods, the printing method is recognized as being the most inexpensive method.

In general, the color filter for liquid crystal display is composed of a combination of a large number of sets of pixels of the three primary colors, i.e. red, green and blue colors formed on a transparent substrate. Between the respective pixels, there is formed a light shielding region of a pre-set width, known as a black matrix for raising the display contrast.

For manufacturing a color filter having such pixels or light shielding region if the ink transfer by the printing method is used (see FIG. 1), ink 11 is first transferred from the surface of a plate 10 to a blanket 13 and then to a glass substrate 12 in order to transfer the ink 11 on the plate surface to the glass substrate. Since the ink becomes stringy during this transfer, the pattern of the plate 10 is not precisely reproduced by the contour of the transferred pattern but smudge or uneven covering is produced, thus leading to formation of irregularities along a direction of thickness A of the ink 11 as shown in FIG. 1. That is, if the transfer method by the printing method is utilized, printing pattern precision can hardly be produced, while the resulting printed surface is poor in smoothness. Thus, the printing method cannot be said to be proper as a method for preparing a wiring for the printed matter or the printed wiring board, to say nothing of the color filter for liquid crystal display.

For prohibiting e.g., smudge of pixels of each color region of the color filter for realizing coloring of high precision, there has been proposed a method of preparing a black matrix which can be previously prepared by a photolithographic method. In Japanese Laid-open Patent Application No. 82-108407, there has been disclosed a method for forming a non-diffusion pattern, using a black-hued material poor in wettability for prohibiting the ink from being diffused out of an intended pixel area. However, since the ink has to exhibit excellent wettability with respect to a material to be printed, such as a substrate, it is difficult to select an ink material which is wettable with respect to the substrate while being hardly wettable with respect to the non-diffusion pattern.

SUMMARY OF THE INVENTION

It is therefore an object of the present invention to provide a method for transferring ink by a printing method for inexpensively preparing a printed matter, a wiring for a printed wiring board or a color filter for a liquid crystal display, which is capable of realizing a high-precision printing pattern comparable to that realized by photolithography by precisely reproducing the printing pattern of the plate by the printing method.

The above and other objects of the invention will become apparent from the following description.

According to the present invention, there is provided a method for transferring ink on a plate onto a material to be printed by a printing method comprising the steps of providing the ink at predetermined positions on the plate, which ink is sensitive to the field to increase its viscosity so as to have a solidified state or a semi-solidified state, applying the field to the ink to maintain configuration of the ink provided at the predetermined positions on the plate, and transferring the ink onto the material to be printed while maintaining the ink in such solidified or semi-solidified state.

PREFERRED EMBODIMENTS OF THE INVENTION

Figure 1:
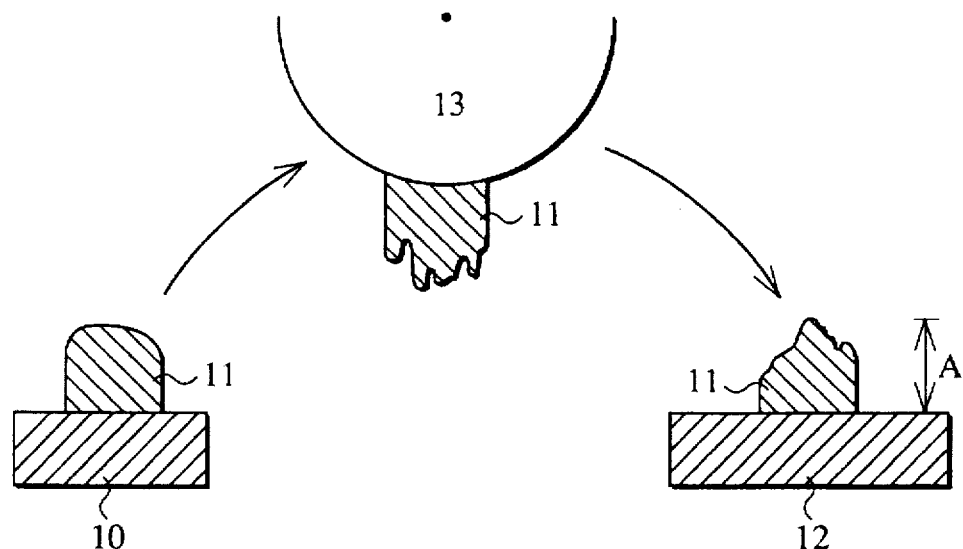
FIG. 1 illustrates a process for transferring ink for producing a color filter by the conventional printing method.

The printing system in general may be enumerated by relief printing, intaglio printing, lithography, waterless plate lithographic printing and screen printing. Of these, intaglio printing, waterless plate lithographic printing or screen printing are preferred and, in particular, intaglio printing is most preferred in the present invention.

In the method of transferring ink onto a material to be printed according to the present invention, ink sensitive to a field to increase its viscosity so as to have a solidified state or a semi-solidified state is provided at predetermined positions such as a printing pattern on a plate as later explained. The field is then applied to the ink to maintain configuration of the ink provided at the predetermined positions on the plate, and the ink is transferred onto the material to be printed while maintaining the ink in a semi-solidified state or in a solidified state. As the field, an electrical field and/or a magnetic field may be employed. The ink being maintained in the solidified state or in the semi-solidified state by application of the field means that the ink maintains its shape without becoming collapsed under its own gravity.

There is no particular limitation imposed on the time period of application of the field if such time period is subsequent to the provision of the ink at the predetermined positions on the plate and is such a time period that the ink is ready to be transferred onto the material to be printed while maintaining the ink in the solidified or semi-solidified state by the application of the field. Thus, the time period may be suitably selected depending upon of the transferring methods or the kinds of inks.

In the transferring step after the step of applying the field to the ink, the ink may be directly transferred from the plate on the material to be printed. In this case, it is preferred that the field be applied to the ink placed at least at a position where the plate is directly contacted with the material to be printed and where the ink is immediately before being subjected to the transferring step.

In the transferring step after the step of applying the field to the ink, the ink may be transferred from the plate via an intermediate transfer body onto the material to be printed. In this case, it is preferred that the field be applied to the ink placed at least at a position where the plate is directly contacted with the intermediate transfer body, and where the ink is immediately before being transferred onto the intermediate transfer body and the field be also applied to the ink placed at least at a position where the intermediate transfer body is directly contacted with the material to be printed and where the ink is immediately before being transferred onto the material to be printed.

The field may be applied transiently, stepwise or continuously at the above-mentioned desirable positions, provided that the ink is previously provided at the pre-set positions on the plate. The intermediate transfer body mentioned herein may precisely transfer the ink from the plate to the material to be printed and may be enumerated by a rubber blanket used in common lithography, and a plastic film used in film transfer printing. These examples of the intermediate transfer body are given only by way of illustration.

The ink transferred to the material to be printed and maintained in the semi-solidified or solidified state may be fixed on the material to be printed by subsequent spontaneous drying and curing by evaporation of the solvent in the ink, oxidation polymerization curing, thermal curing or radiation curing. There is no limitation to the method for curing the ink and two or more curing methods may be used in combination. The curing may be performed as the field is applied to the transferred ink. It is, however, desirable from the viewpoint of the manufacturing process to cure the ink immediately after transferring the ink maintained in the semi-solidified state or in the solidified state to the material to be printed.

A series of illustrative operating methods up to curing of the ink in case of employing the electric field as the field in the transferring method of the present invention will now be explained.

Figure 2:
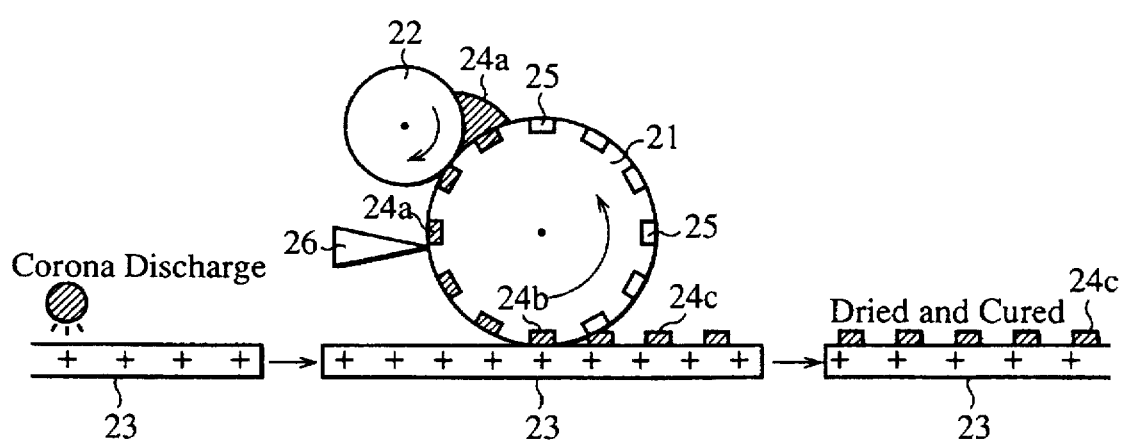
FIG. 2 illustrates a process in which an intaglio printing method is employed and an electrical field is applied as a field in the method of the present invention and in Example 1.

An illustrative method by intaglio printing is explained by referring to FIG. 2.

An insulating material to be printed 23, such as paper or glass, is subjected to corona discharge so as to be charged to have positive or negative charges. On the other hand, a gravure plate 21 having an insulating surface is rotated along with a doctor roll 22 so that ink 24a is introduced into a pattern formed by recesses 25 in the gravure plate 21 while at the same time the residual ink 24a is scraped off with a scraper 26. In transferring the ink 24a introduced and deposited in the recesses 25 in the gravure plate 21, the electrical field is applied to at least an area where the ink 24a is present when the gravure plate 21 and the material to be printed 23 are contacted with each other, because electrical charges are generated by the corona discharge on the material to be printed 23. Thus, the ink 24a is raised in its apparent viscosity and hence the ink 24b in the semi-solidified state or in the solidified state is formed. By such application of the electrical field, the ink 24b in the semi-solidified state or in the solidified state is transferred to the material to be printed 23. The ink 24b is subsequently dried and cured by a method of applying heat or radiating UV rays to the material to be printed 23 on which the electrical field is applied, so that cured ink 24c is now formed on the material to be printed 23.

Figure 3:
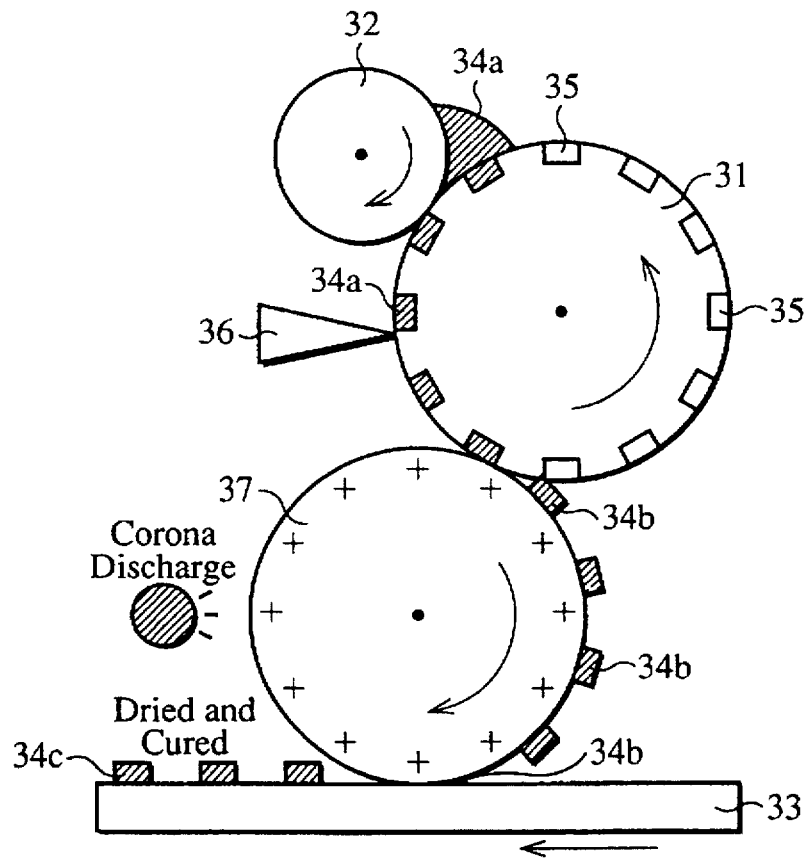
FIG. 3 illustrates a process in which a lithographic printing method is employed and an electrical field is applied as a field in the method of the present invention and in Example 5.

Another illustrative method by lithography is explained by referring to FIG. 3.

A gravure plate 31 having an insulating surface is rotated along with a doctor roll 32, so that ink 34a is introduced into a pattern formed by recesses 35 in the gravure plate 31, while at the same time the residual ink 34a is scraped off with a scraper 36. In transferring the ink 34a introduced and deposited in the recesses 35 in the plate 31 onto an insulating rubber blanket 37 previously charged to a positive or negative polarity by corona discharge, the plate 31 and the rubber blanket 37 are contacted with each other so that the electrified rubber blanket 37 operates for applying an electrical field at least to portions where the ink 34a exists. This increases the apparent viscosity of the ink 34a so that a semi-solidified or solidified ink 34b is formed. By the application of the electrical field, ink 34b in the semi-solidified state or in the solidified state, which correctly retains the shape of the recesses 35, is transferred to the rubber blanket 37. The ink 34b on the rubber blanket 37 is then transferred to an insulating material to be printed 33, such as paper or glass. By the operation of the electrified rubber blanket 37, an electrical field is continuously applied to the ink 34b on the rubber blanket 37 so that the ink is further raised in apparent viscosity and hence is transferred to the material to be printed 33 in such a state in which the shape of the recesses 35 is retained accurately. After transfer, the ink 34b is dried and cured by applying heat or radiating UV rays to the material to be printed 33 onto which the ink 34b has been transferred, so that cured ink 34c is formed on the material to be printed 33.

Figure 4:
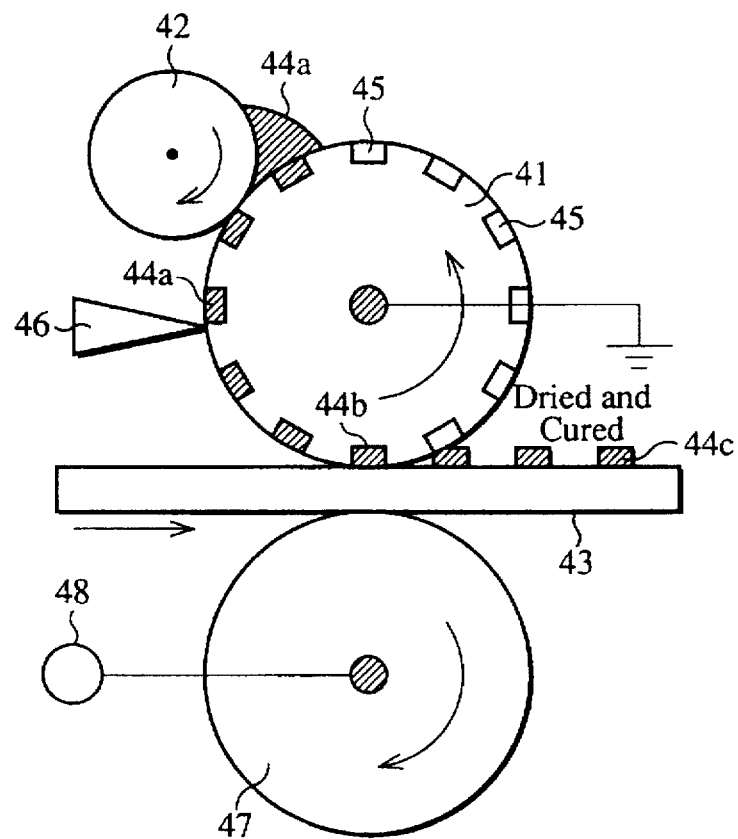
FIG. 4 illustrates a process in which an intaglio printing method is employed and an electrical field is applied as a field in the method of the present invention and in Example 3.
Figure 6:
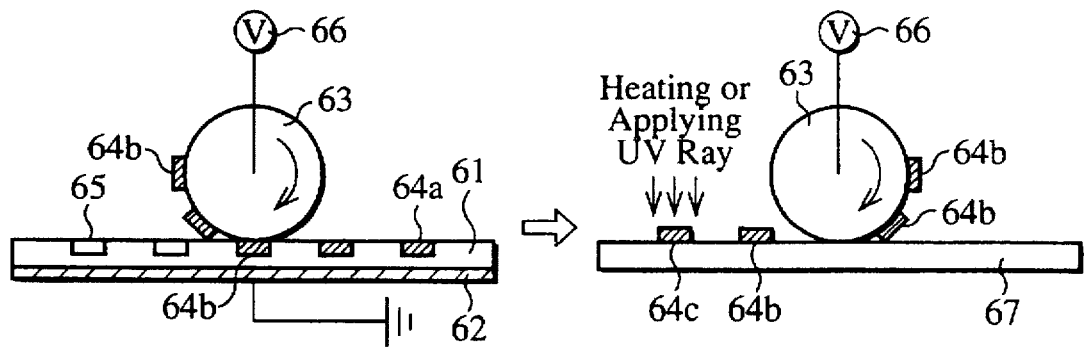
FIG. 6 illustrates a process in which an intaglio printing method is employed and an electrical field is applied as a field in the method of the present invention and in Example 4.

Another illustrative method employing intaglio printing is explained by referring to FIGS. 4 and 6.

Referring to FIG. 4, a grounded insulating gravure plate 41 is rotated along with a doctor roll 42. Ink 44a is introduced into a pattern formed by recesses 45 in the gravure plate 41, while the same time the residual ink 44a is scraped by a scraper 46. In transferring the ink 44a introduced and deposited in the recesses 45 of the gravure plate 41, high electrical voltage is applied by a high voltage source 48 to the back surface of a material to be printed 43 via an insulating pressure drum 47 having an electrically conductive layer, not shown. Thus an electrical field is applied to contact portions between the gravure plate 41 and the portions of the material to be printed 43 where at least the ink 44a exists. By such application of the electrical field, the ink 44b in the semi-solidified state or in the solidified state, which precisely retains the shape of the recess 45, is formed and transferred to the material to be printed 43. Immediately after transfer, the ink 44b is dried and cured by applying heat or radiating UV rays to the material to be printed 43 on which the ink 44b has been transferred, so that cured ink 44c is now formed on the material to be printed 43.

On the other hand, a rotating blanket 63 connected to a high voltage source 66 is contacted with an insulating plate 61 having an electrically conductive layer 62 on its back side and having ink 64a deposited in recesses 65 constituting a printing pattern. By the blanket 63 thus being contacted with the plate 61, an electrical field is applied to contact portions between the plate 61 and the blanket 63 so that the ink 64a in the recesses 65 is increased in apparent viscosity and hence ink 64b retaining a semi-solidified or solidified state is progressively transferred to the blanket 63. The blanket 63 is then contacted with a material to be printed 67, as the blanket 63 is rotated to transfer the ink 64b maintained in the semi-solidified state or in the solidified state to the material to be printed 67. The ink 64b thus transferred is dried and cured by heating or irradiation with UV rays for forming cured ink 64c on the material to be printed 67.

Figure 9:
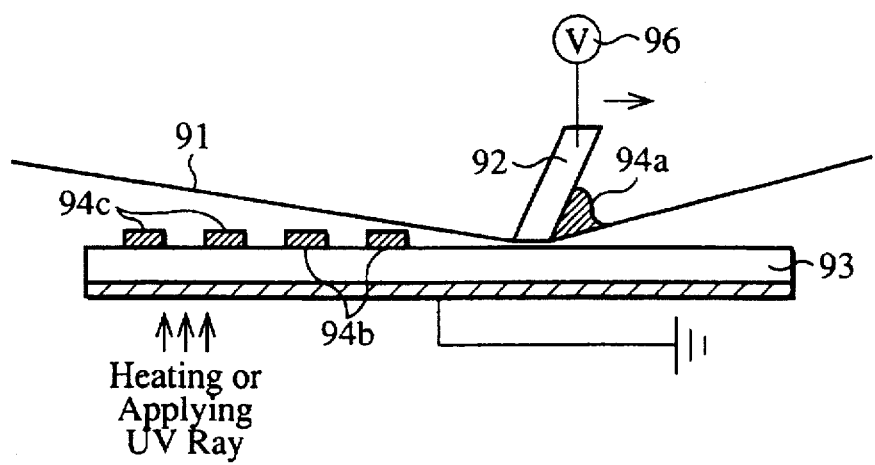
FIG. 9 illustrates a process in which a screen printing method is employed and an electrical field is applied as a field in the method of the present invention and in Example 7.

The transferring method employing the screen printing method is explained by referring to FIG. 9.

High electrical voltage is applied by a high voltage source 96 connected to a squeegee 92 for applying high electrical voltage to a space between a material to be printed 93 and a screen 91 along which the squeegee 92 is moved, as shown in FIG. 9. The side of the squeegee 92 directed to ink 94a is insulated. Thus, the ink 94a is transferred through the screen 91 to the material to be printed 93 as semi-solidified or solidified ink 94b. By such transfer, the pattern of the screen 91 may be printed with good reproducibility on the material to be printed 93 without incurring cohesive failure of the ink shown in FIG. 1.

Figure 10:
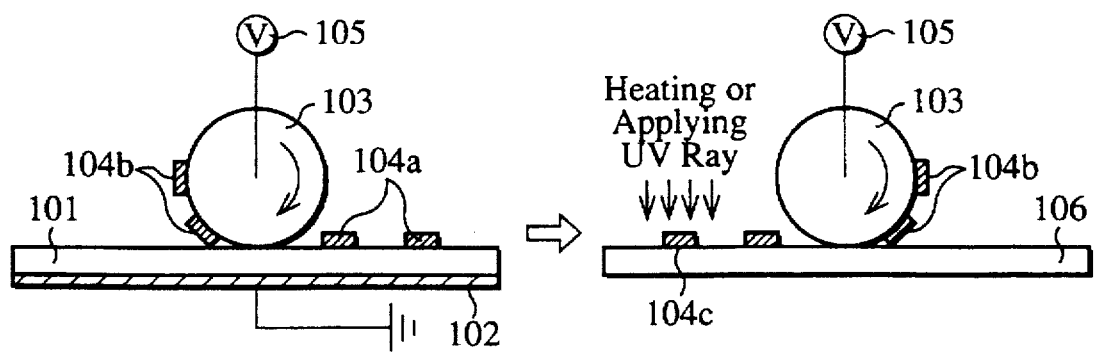
FIG. 10 illustrates a process in which a waterless plate lithographic printing method is employed and an electrical field is applied as a field in the method of the present invention and in Example 6.

The transfer method employing a lithographic plate is explained by referring to FIG. 10 in which the lithographic plate is a waterless plate for lithographic printing.

Referring to FIG. 10, a pre-set pattern of ink 104a is previously formed on a waterless plate for lithographic printing 101 having an electrically conductive layer 102 on its back surface and a blanket 103 connected to a high voltage source 105 is contacted with the waterless plate for lithographic printing 101 as the blanket is rotated. By the blanket 103 thus being contacted with the plate 101, an electrical field is applied to contact portions between the plate 101 and the blanket 103 so that the ink 104a is increased in viscosity and hence ink 104b retaining a semi-solidified or solidified state is progressively transferred to the blanket 103. The blanket 103 is then contacted with a material to be printed 106, as the blanket is rotated. Thus, the ink 104b maintained in the semi-solidified state or in the solidified state is progressively transferred to the material to be printed 106. The ink 104b thus transferred is dried and cured by heating or irradiation with UV rays for forming cured ink 104c on the material to be printed 106.

Figure 5:
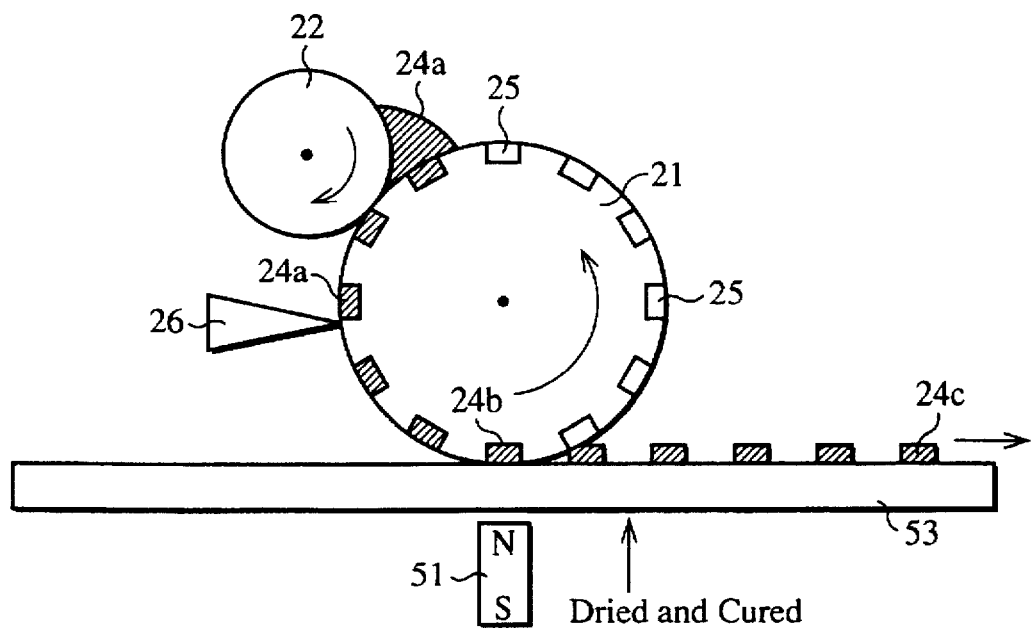
FIG. 5 illustrates a process in which an intaglio printing method is employed and a magnetic field is applied as a field in the method of the present invention and in Example 2.
Figure 7:
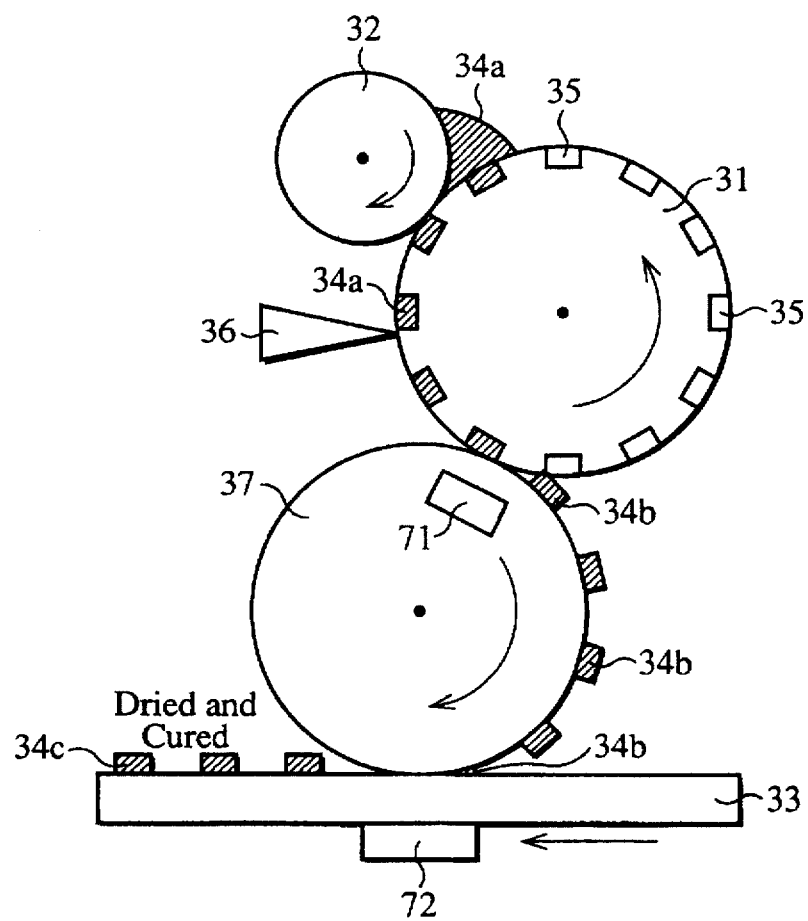
FIG. 7 illustrates a process in which an intaglio printing method is employed and a magnetic field is applied as a field in the method of the present invention.
Figure 8:
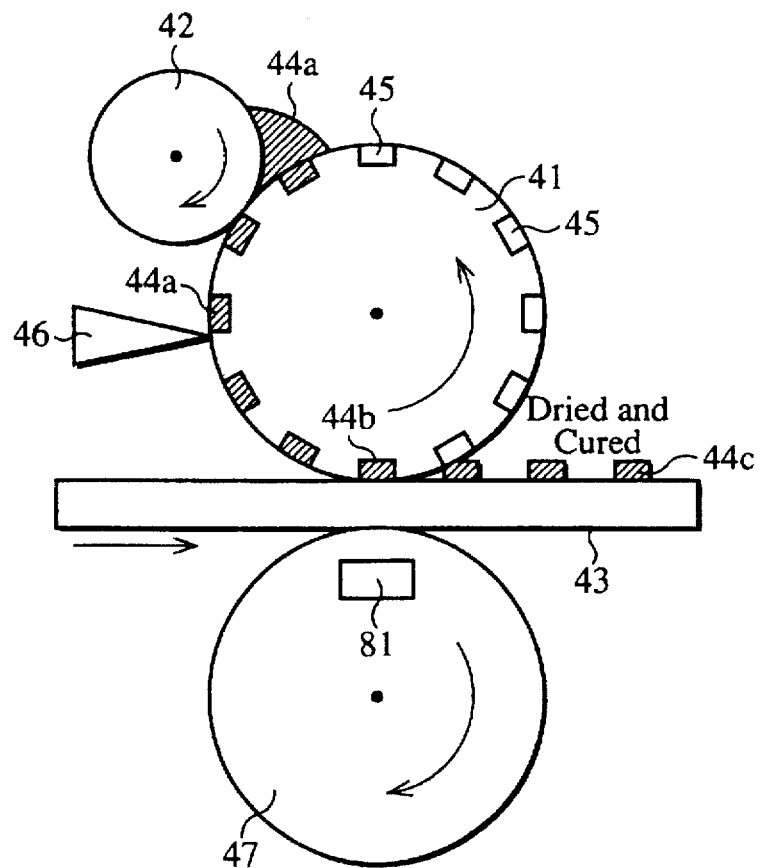
FIG. 8 illustrates a process in which an intaglio printing method is employed and a magnetic field is applied as a field in the method of the present invention.

Referring to FIGS. 6, 7 and 8, illustrative examples in which a magnetic field is employed as a field in the transferring method shown in FIGS. 2, 3 and 4, respectively, will now be explained. In FIGS. 5, 7 and 8, parts or components common to those shown in FIGS. 2, 3 and 4 are depicted by the same reference numerals, and the corresponding description is omitted for simplicity.

Referring to FIG. 5, a magnetic field is applied by a magnet 51 to a contact portion between a material to be printed 53 and the gravure plate 21 from the outside of the non-electrified material to be printed 53. Thus, ink 24b is maintained in the semi-solidified state or in the solidified state under the effect of the magnetic field. The ink 24b maintained in the semi-solidified or solidified state can subsequently be transferred to the material to be printed 53.

Referring to FIG. 7, a magnetic field is applied with a magnet 71 to contact portions between the plate 31 and the blanket 37 for applying the magnetic field to ink 34a for transferring ink 34b maintained in the semi-solidified state or in the solidified state to the blanket 37. A magnetic field is then applied by a magnet 72 at contact portions between the blanket 37 and the material to be printed 33 for again raising the viscosity of the ink 34b for transferring the ink 34b to the material to be printed 33.

Referring to FIG. 8, a magnetic field is applied to contact portions between the plate 41 and the material to be printed 43 by a magnet 81 for raising the viscosity of ink 44a to produce ink 44b maintained in the semi-solidified or solidified state which is transferred to the material to be printed 43.

There is no limitation imposed on the intensity of the field provided it is of such a value as to maintain the semi-solidified or solidified state of the ink sensitive to the field, such that the value of intensity may be suitably selected depending upon the kinds of the ink as later explained.

In the method of the present invention, the ink which may contain varnish should be sensitive to the field and is raised in its viscosity so as to be semi-solidified or solidified responsive to the field employed. The ink which becomes semi-solidified or solidified by application of the field may not subsequently maintain its semi-solidified or solidified state under conditions in which the field is not being applied.

Ink which is raised in viscosity responsive to the electric field to assume the semi-solidified or solidified state, includes ink exhibiting electrotheological effect, referred to hereinafter as ER effect. The ER effect means that a fluid is increased in viscosity upon application of an electrical field to the fluid, so that ink having the ER effect means ink which is increased in viscosity upon application of an electrical field to maintain the above-mentioned semi-solidified or solidified state.

Such ink may be composed of ingredients suitably selected from pigments and/or dyestuffs, which function as colorants, particles or liquid crystal materials having ER effect sensitive to the electrical field, binders, solvents or additives that may be commonly employed for ink, varnish cured by irradiation with radiation rays, vehicles cured by heating, and photopolymerization initiators. That is, if the colorants exhibit the ER effect, the colorants are indispensable ingredients, whereas if the colorants fail to exhibit the ER effect, the particles or the liquid crystal materials exhibiting the ER effect are the indispensable ingredients. The desirable composition for the ink may, for example, be 3 to 50 percent by weight of the colorant, 10 to 90 percent by weight of the binder, 0 to 80 percent by weight of the solvent, 0 to 50 percent by weight of the particles and liquid crystal material exhibiting the ER effect, and 0 to 15 percent by weight of the photopolymerization initiator.

The pigments may be enumerated by Benzidine Yellow, Hansa Yellow, Prussian Blue, Phthalocyanine Blue, Carmine 6B, Lake Red, zinc flower, titanium oxide and carbon black.

The dyestuffs may be enumerated by Sulphur Black T, spirit blue, Sudan II, Naphthol AS, Aniline Black and Erio Black T.

The particles exhibiting the ER effect mean that a fluid comprised of the particles dispersed in a liquid exhibits the ER effect. Specifically, these particles may be enumerated by particles of sodium polyacrylate, a sulfonated product of a styrene- divinylbenzene cross-linked polymer or an alkali metal salt thereof, microcrystal cellulose, silica gel, alumina, silica-alumina, clay, titanium oxide, mesophase pitch, and carbonaceous particles. The ER effect of the ink may occasionally be improved by adding a minor quantity of water to these particles. Although there is no limitation imposed on the particle size of the particles exhibiting the ER effect, insofar as the particles are soluble in ink, it is preferred that such particle size be 0.005 to 500 µm.

The liquid crystal material exhibiting the ER effect may be enumerated by high molecular liquid crystal materials exhibiting lyotropic liquid crystallinity and thermotropic liquid crystallinity. In particular, the high molecular liquid crystal material exhibiting lyotropic liquid crystallinity is preferred. The high molecular liquid crystal material may preferably be completely dissolved in a solvent.

The high molecular liquid crystal material exhibiting lyotropic liquid crystallinity may be enumerated by polypeptide, aromatic polyamide, cellulose and derivatives thereof, polyamide hydrazide, polyhydrazide, polyisocyanate, polyphosphazene, amphipathic block copolymers having hydrophilic blocks and hydrophobic blocks, ribonucleic acid, and deoxyribonucleic acid. In particular, polypeptide and polyisocyanate are preferred. Of the polypeptides, poly(γ-glutamate) is preferred.

The high molecular liquid crystal materials exhibiting the ER effect include a high molecular liquid crystal compound in which plural liquid crystal groups are linked to a sole molecular chain directly or via a spacer. The high molecular liquid crystal compound may be enumerated by a side chain type high molecular liquid crystal compound in which liquid crystal groups are linked like branches to a sole molecular chain directly or via a spacer, a main chain type high molecular liquid crystal compound in which both liquid crystal groups and molecular chains are present in the main chain, and a composite type high molecular liquid crystal compound in which liquid crystal groups are further linked to liquid crystal groups and/or molecular chains of the main chain type liquid crystal compound. The liquid crystal materials exhibiting the ER effect include monomeric liquid crystals usually employed for a display device in addition to the above-mentioned high molecular liquid crystal compounds.

The particles or liquid crystal materials exhibiting the ER effect need not necessarily be contained if the pigments and the like exhibiting the ER effect are employed as the colorants. The pigments exhibiting the ER effect mean that a fluid obtained by dispersing the pigments in a liquid exhibits the ER effect.

The binders used for ink include those employed for conventional gravure ink, offset ink or UV curable ink. Examples of these binders include metal salt rosin, rosin modified phenolic resin, petroleum resin, polymerized linseed oil and acrylic oligomers.

The vehicles cured by irradiation of UV rays or electron beams include monomers or oligomers cured by radicals, such as 2-ethyl hexyl acrylate, 1,4-butanediol diacrylate, neopentyl glycol diacrylate, polyethylene glycol diacrylate, trimethylol propane triacrylate, pentaerythritol triacrylate, dipentaerythritol hexaacrylate, epoxy acrylate, urethan acrylate and polyester acrylate; and monomers or oligomers cured by cationic active species, such as phenyl glycidyl ether, bisphenol A diglycidyl ether, bisphenol F diglycidyl ether, resorcinol glycidyl ether, novolac glycidyl ether, dimeric acid glycidyl ester, vinyl cyclohexene diepoxide, dicyclo pentadiene epoxide and epoxidated soybean oil.

The photopolymerization initiators contained in the composition for curing ink with UV rays include compounds which generate radicals upon irradiation with light, such as methyl benzoin ether, 2,2-diethoxy acetophenone, benzophenone or benzil; and compounds which generate cations upon irradiation with light, such as diallyl diazonium salt I, diallyl iodonium salt II, triallyl sulfonium salt III, boron tetrafluoride, phosphorus hexafluoride, arsenic hexafluoride or antimony hexafluoride.

The varnishes to be contained in the composition for curing ink by heat include varnishes containing alkyd resins or drying oil employed for conventional offset printing. Driers such as lead naphthenate, cobalt naphthenate or manganese naphthenate for promoting the curing and, in addition, a system cured by a catalyst or by heating, such as melamine, urea, polyester, urethane or epoxy based systems, may be employed.

The solvents used for ink include those used for common gravure ink, offset ink or UV curable ink. These solvents may be enumerated by e.g., toluene, high boiling point hydrocarbon solvents or acrylic monomers.

Ink capable of increasing its viscosity responsive to the magnetic field so as to assume the semi-solidified or solidified state includes the same inks as those used in case of employing the electrical field except that fine particles sensitive to the magnetic field, such as magnetite, ferrite, iron, cobalt or nickel, are used in place of the liquid crystal materials or the particles exhibiting the ER effect. The particle size of the fine particles sensitive to the magnetic field is preferably 0.005 to 500 µm. If the pigments or dyestuffs sensitive to the magnetic field are used as pigments or dyestuffs, it is unnecessary to add the fine particles sensitive to the magnetic field. The pigments or dyestuffs include the compounds similar to those used for the ink in case of employing the electrical field. The other materials similar to those used for the ink in case of employing the electrical field may be employed. The ink composition in case of employing the magnetic field is preferably 3 to 50 percent by weight of the colorant, 10 to 90 percent by weight of the binder, 0 to 80 percent by weight of the solvent, 0 to 50 percent by weight of the fine particles sensitive to the magnetic field and 0 to 15 percent by weight of the photopolymerization initiator.

With the transferring method of the present invention, the pattern of a plate may be correctly reproduced on a material to be printed, such that printed matter of high precision, wiring for a printed wiring board or a color filter for liquid crystal display comparable to those produced by photolithography may be produced inexpensively.

EXAMPLES OF THE INVENTION

The present invention will be explained in more detail with reference to illustrative examples which, however, are not intended for limiting the invention.

Example 1

Preparation of Ink Having ER Effect 10 g of Phthalocyanine Blue as a colorant, 20 g of titanium oxide as fine particles exhibiting the ER effect, 20 g of a petroleum resin as a binder manufactured by NIPPON PETROCHEMICALS CO., LTD., under a trade name of NEOPOLYMER GS, and 50 g of toluene as a solvent, were mixed in a ball mill for preparing ink A.

Using a dual cylinder rotary viscometer fitted with a unit for application of an electrical field (manufactured by IWAMOTO SEISAKUSHO CO., LTD.), changes in viscosity by application of the electrical field to the ink A were checked. It was found that the apparent viscosity was increased by the application of the electrical field. Thus, it was confirmed that the ink A had the ER effect.

Transfer

The ink A was transferred using the device shown in FIG. 2. That is, the ink A (ink 24a) was charged into the recesses 25 in the insulated gravure plate 21. A glass plate (material to be printed 23) electrified by corona discharge and the gravure plate 21 were contacted with each other for transferring the ink A carried in the recesses 25 in the plate 21 to the glass plate 23. A high electrical field was established at this time between the glass plate 23 and the plate 21 so that the ink A in the recesses 25 was raised in apparent viscosity and assumed a semi-solidified state such that the ink A in the recesses 25 (ink 24b) was transferred in its entirety to the glass plate 23.

Immediately after transfer, the glass plate 23 was heated to 100° C. for drying and curing the semi-solidified ink A (ink 24c), while attention was paid so that the electrical charges are not evaded by possible contact discharge between the glass plate and an electrically conductive portion. It was found that the pattern in the recesses 25 in the plate 21 was correctly transferred to the glass plate 23.

Comparative Example 1

The ink A in the recesses 25 was transferred to the glass plate 23 in the same way as in Example 1 except using the glass plate 23 not processed with corona discharge, that is except not applying the electrical field to the ink A on the surface of the plate 21. It was seen that the ink A in the recesses 25 of the plate 21 was not correctly transferred but was collapsed in shape.

Example 2

Preparation of Ink having ER Effect

Each 1 mol/liter of an aqueous solution of ferrous sulfate and an aqueous solution of ferric sulfate was mixed and agitated together to give a solution, to which an aqueous solution of 6N sodium hydroxide was added dropwise until pH was equal to 11. The resulting solution was agitated at 60° C. for one hour for forming magnetite. For removing sodium sulfate, the magnetite was precipitated and a supernatant was removed. This operation of precipitation and removal was repeated until pH was equal to pH7. Then, methanol was added to the resulting system for precipitating magnetite. The supernatant was removed and the resulting mass was dried under vacuum at 80° C. for producing magnetite with a mean particle size of 0.5 μm.

Then, 30 g of 2-ethyl hexyl acrylate, 50 g of trimethyl propane triacrylate and 20 g of polyester acrylate manufactured by TOAGOSEI CHEMICAL INDUSTRY CO., LTD. under a trade name of ARONIX 7100 were mixed together to give a varnish, to which 5 g of magnetite previously prepared and 10 g of carbon black were added and the resulting mixture was kneaded in a ball mill. To the resulting kneaded mass were dissolved 8 g of DAROCURE 1173 manufactured by NIPPON CIBA GEIGY CO., LTD. to produce black-hued ink B. This black ink had the viscosity of 80 cp at room temperature.

Transfer

The ink B was transferred using a device shown in FIG. 5. That is, the ink B (ink 24a) was deposited in the recesses 25 of the insulated gravure plate 21 and a magnetic field was applied by the permanent magnet 51 from the side of the glass plate 53 as the material to be printed. The ink B was raised in apparent viscosity and assumed a semi-solidified state. The ink B (ink 24b) in the semi-solidified state was transferred to the glass plate 53 and immediately cured by irradiation with UV rays to give the cured ink B (ink 24c). It was found that the pattern of the recess 25 in the plate 21 was accurately transferred to the glass plate 53.

Comparative Example 2

The ink B was transferred to the glass plate 53 in the same way as in Example 2 except not applying the magnetic field. It was found that the ink B in the recesses 25 failed to be transferred correctly such that a correct pattern could not be achieved.

Example 3

Preparation of Ink having ER Effect 25 g of a petroleum resin manufactured by NIPPON PETROCHEMICALS CO., LTD. under a trade name of NEORESIN 660 were dissolved in a mixed solution of 12 g of No.7 linseed oil and 33 g of a solvent manufactured by NIPPON OIL CO., LTD. under a trade name of AF-7. To the resulting solution were added 30 g of fine particles of a carbonaceous material having the ER effect and the resulting mixture was kneaded to prepare ink C.

Transfer

The ink C was transferred using the device shown in FIG. 4. That is, the ink C (ink 44a) was deposited in the recesses 45 of the plate 41 and an electrical field was applied to a space between the plate 41 and the pressure drum 47 for transferring the ink C (ink 44b) to the material to be printed 43. A high electrical field was established at this time between the plate 41 and the drum 47 so that the ink C in the recesses 45 (ink 44b) was raised in apparent viscosity and assumed a semi-solidified state such that the ink C in the recesses 45 (ink 44b) was transferred in its entirety to the glass plate 43. Immediately after transfer, the material to be printed 43 was dried by heating to 150° C. to give cured ink 44c. The pattern of the recesses 45 in the plate 41 was printed on the material to be printed 43 with good reproducibility.

Example 4

Preparation of Ink having ER Effect

As a liquid crystal high molecular material having the ER effect, 5 g of a γ-benzyl L glutamate- γ-dodecyl L glutamate copolymer with a dodecylating ratio of 70%, and 20 g of a petroleum resin manufactured by NIPPON PETROCHEMICALS CO., LTD. under a trade name of NEOPOLYMER S were dissolved in a mixed solution of 10 g of No. 7 linseed oil and 35 g of a solvent manufactured by NIPPON OIL CO., LTD. under a trade name of AF-7. To the resulting solution were added 30 g of Brilliant Carmine and the resulting mixture was kneaded using three roll unit to prepare ink D.

Transfer

The ink D was transferred using the device shown in FIG. 6. That is, the ink D (ink 64a) was charged into the recesses 65 of the plate 61 and an electrical field was applied to a space between the plate 61 and the blanket 63. The ink D thus maintained in the semi-solidified state or in the solidified state (ink 64b) was transferred to the blanket 63 and then to the material to be printed Immediately after transfer, the material to be printed 67 was dried by heating to 150° C. to give cured ink 64c. The pattern of the recesses in the plate 61 was printed on the material to be printed 67 with good reproducibility.

Example 5

Preparation of Ink having ER Effect 25 g of a petroleum resin manufactured by NIPPON PETROCHEMICALS CO., LTD. under a trade name of NEORESIN 540, were dissolved in a mixed solution of 12 g of No.7 linseed oil, 10 g of maleinated polybutadiene manufactured by NIPPON PETROCHEMICALS CO., LTD. under a trade name of M-3000-20 and 23 g of a solvent manufactured by NIPPON OIL CO., LTD. under a trade name of AF-7. To the resulting solution were added 30 g of fine particles of a carbonaceous material having the ER effect and the resulting mixture was kneaded by a three roll unit to prepare ink E.

Transfer

The ink E was transferred using the device shown in FIG. 3. That is, the ink E (ink 34a) was charged into the recesses 35 of the plate 31 and an electrical field was applied to the blanket 37. The ink E (ink 34b) was transferred to the blanket 37 and then to the material to be printed 33. Immediately after transfer, the material to be printed 33 was dried by heating to 150° C. to give cured ink 34c. The pattern of the recesses in the plate 31 was printed on the material to be printed 33 with good reproducibility.

Example 6

Preparation of Ink having ER Effect 25 g of a petroleum resin manufactured by NIPPON PETROCHEMICALS CO., LTD. under a trade name of NEORESIN 660 were dissolved in a mixed solution of 7 g of No.7 linseed oil, 15 g of maleinated polybutadiene manufactured by NIPPON OIL CO., LTD. under a trade name of M-3000-20 and 23 g of a solvent manufactured by NIPPON OIL CO., LTD. under a trade name of AF-7. To the resulting solution were added 30 g of fine particles of a carbonaceous material having the ER effect and the resulting mixture was kneaded to prepare ink F.

Transfer

The ink F was transferred using the device shown in FIG. 10. That is, an electrical field was applied to a space between the waterless plate for lithographic printing 101 and the blanket 103 for raising the viscosity of ink F (ink 104a). The ink F thus maintained in the semi-solidified state or in the solidified state (ink 104b) was transferred to the blanket 103 and then to the material to be printed 106. Immediately after transfer, the material to be printed 106 was dried by heating to 150° C. to give cured ink 104c. The pattern of the recesses in the waterless plate 101 was printed on the material to be printed 106 with good reproducibility.

Example 7

Preparation of Ink having ER Effect 10 g of rosin ester manufactured by ARAKAWA CHEMICAL INDUSTRIES, LTD. were dissolved in a mixed solvent formed by 20 g of MINERAL SPIRIT manufactured by NIPPON OIL CO., LTD., 20 g of HISOL 100 manufactured by NIPPON PETROCHEMICALS CO., LTD. and 10 g of ethylhydroxy cellulose. To the resulting solution were added 35 g of clay as particles exhibiting ER effect and 5 g of Brilliant Carmine 6B as a pigment. The resulting mixture was kneaded by a three roll unit to prepare ink G.

Transfer

The ink G was transferred using the device shown in FIG. 9. That is, an electrical field was applied to a space between the screen 91 along which the squeegee 92 is moved and the material to be printed 93 for raising the viscosity of the ink G (ink 94a). The ink G (ink 94a) thus raised in apparent viscosity was transferred from the screen 91 to the material to be printed 93. Immediately after transfer, the material to be printed 93 was dried by heating to 150° C. to give cured ink 94c. The pattern in the screen 91 was printed on the material to be printed 93 with good reproducibility.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for transferring ink on a plate onto a material to be printed by a printing method, said method comprising the steps of:

providing ink at positions on a plate, the ink being sensitive to a field selected from the group consisting of an electrical field, a magnetic field, and combination thereof;

applying the field to the ink to increase its viscosity so as to have a state selected from the group consisting of a solidified state and a semi-solidified state, so as to maintain configuration of the ink provided at the positions on the plate; and transferring the ink onto said material to be printed while maintaining the ink in said state.

2. The method according to claim 1 further comprising a step of curing said ink after said transferring step.

3. The method according to claim 1 wherein said printing method is selected from the group consisting of a relief printing, an intaglio printing, waterless plate lithographic printing and screen printing.

4. The method according to claim 1 wherein in said transferring step after the step of applying the field to the ink, said ink is transferred directly from said plate on said material to be printed.

5. The method according to claim 4 wherein said field is applied to said ink placed at least at a position where said plate is directly contacted with said material to be printed and where said ink is immediately before being subjected to said transferring step.

6. The method according to claim 1 wherein in said transferring step after the step of applying the field to the ink, said ink is transferred from said plate via an intermediate transfer body onto said material to be printed.

7. The method according to claim 6 wherein said field is applied to said ink placed at least at a position where said plate is directly contacted with said intermediate transfer body and where said ink is immediately before being transferred onto said intermediate transfer body and wherein said field is also applied to said ink placed at least at a position where said intermediate transfer body is directly contacted with said material to be printed and where said ink is immediately before being transferred onto said material to be printed.

8. The method according to claim 1 wherein said field is an electrical field and wherein said ink is raised in its viscosity when the electrical field is applied to said ink.

9. The method according to claim 8 wherein said ink contains particles which raise viscosity of the ink when applying the electrical field.

10. The method according to claim 9 wherein said particles are selected from the group consisting of sodium polyacrylate, sulfonated product of a styrene-divinylbenzene cross-linked polymer and an alkali metal salt of said sulfonated product, microcrystal cellulose, silica gel, alumina, silica-alumina, clay, titanium oxide, mesophase pitch, carbonaceous particles and mixtures thereof.

11. The method according to claim 8 wherein said ink contains a liquid crystal material which raises viscosity of the ink when applying the electrical field.

12. The method according to claim 11 wherein said liquid crystal material is selected from the group consisting of polypeptide, aromatic polyamide, cellulose, a derivative of said cellulose, polyamide hydrazide, polyhydrazide, polyisocyanate, polyphosphazene, an amphipathic block copolymer having hydrophilic blocks and hydrophobic blocks, ribonucleic acid, deoxyribonucleic acid, and mixtures thereof.

13. The method according to claim 1 wherein said field is a magnetic field and wherein said ink contains particles which raise viscosity of the ink when applying the magnetic field.

14. The method according to claim 13 wherein said ink further contains fine particles sensitive to the magnetic field.

15. The method according to claim 14 wherein said fine particles are selected from the group consisting of magnetite, ferrite, iron, cobalt, nickel and mixtures thereof.

* * * * *